United States Patent [19]

Sakamoto et al.

[11] Patent Number: 4,717,824
[45] Date of Patent: Jan. 5, 1988

[54] PHOTOELECTRIC DISPLACEMENT DETECTING APPARATUS

[75] Inventors: Hitoshi Sakamoto, Kashiwa; Etsuo Nagashima, Machida; Ryou Nagai, Yokohama, all of Japan

[73] Assignee: Mitutoyo Mfg. Co., Ltd., Japan

[21] Appl. No.: 767,269

[22] PCT Filed: Dec. 3, 1984

[86] PCT No.: PCT/JP84/00573

§ 371 Date: Jul. 25, 1985

§ 102(e) Date: Jul. 25, 1985

[87] PCT Pub. No.: WO85/02459

PCT Pub. Date: Jun. 6, 1985

[30] Foreign Application Priority Data

Dec. 2, 1983 [JP] Japan ................. 58-227860

[51] Int. Cl.[4] .................. H01J 3/14
[52] U.S. Cl. ............... 250/237 G; 340/347 P; 324/175; 356/395
[58] Field of Search ........ 250/231 SE, 237 G; 340/347 P; 324/175; 356/395

[56] References Cited

U.S. PATENT DOCUMENTS

| 4,101,764 | 7/1978 | Nelle ............... 250/237 G |
| 4,363,964 | 12/1982 | Schmitt ............. 250/237 G |
| 4,491,928 | 1/1985 | Reichl .............. 250/237 G |
| 4,519,140 | 5/1985 | Schmitt ............. 250/237 G |

FOREIGN PATENT DOCUMENTS

| 2948854 | 6/1981 | Fed. Rep. of Germany . |
| 2471586 | 6/1981 | France . |
| 0097826 | 6/1981 | Japan . |
| 56-97826 | 8/1981 | Japan . |
| 0204314 | 5/1982 | Japan . |
| 0040684 | 7/1983 | Japan . |
| 58-40684 | 9/1983 | Japan . |

Primary Examiner—Edward P. Westin
Assistant Examiner—Charles F. Wieland
Attorney, Agent, or Firm—Parkhurst & Oliff

[57] ABSTRACT

A photoelectric displacement detecting apparatus for measuring a length from a repeated number of bright and dark portions of light formed by the repetitions of overlappings of slits in respective slit rows during a relative movement between a main scale and an index scale, the apparatus comprising reference marks provided on the main scale at suitable intervals, a mark detecting device provided on the index scale, identification marks provided in spaces between the reference marks for identifying these spaces, and an identification mark reading device actuated by the mark detecting device. An identification mark ascertaining device is provided for comparing the identification mark read by the identification mark reading device with the identification mark preset by a mark selecting-setting device and ascertaining whether both identification marks coincide with each other or not. The apparatus further comprises an origin setting device for making the position of the detected reference mark to be the length measuring origin on condition of a coincidence signal from the identification mark ascertaining device and the mark detection signal from the mark detecting device immediately after the input of the coincidence signal.

12 Claims, 10 Drawing Figures

PHOTOELECTRIC DISPLACEMENT DETECTING APPARATUS

DESCRIPTION

1. Technical Field

This invention relates to a photoelectric displacement detecting apparatus, and more particularly to improvements in a photoelectric displacement detecting apparatus comprising a main scale with a length-measuring slit row having regular pitches, an index scale provided thereon with a length-measuring gate slit row being equal in pitch to the length-measuring slit row of the main scale and disposed in a manner to be in parallel to the direction of the slit row and movable relative to the main scale, and a length-measuring photo-electric transducer for receiving light transmitted through or reflected by the main scale and the index scale producing a length-measuring signal from the number of repeated bright and dark portions of the light formed by the repetitions of overlappings of respective slits during a relative movement between the main scale and the index scale.

2. Background Art

The photoelectric displacement detecting apparatus of the type described are adopted in many fields because displacements can be detected in non-contact with an object to be detected and with high accuracy. However, since with such a functional curve that the detection signals repeat the increases or decreases against the length-measuring direction is drawn, even if a detection signal is processed to be turned into a digital signal, for example, and indicated digitally, the physical absolute origin is unclear only from this signal. In consequence, there has been needed another means to specify the absolute origin.

As measures for specifying the absolute origin in the photoelectric displacement detecting apparatus of the type described, there have heretofore been types shown below.

Firstly, there is a method for forcibly zero-setting an indicated value of digital indicators, including a counter and the like, when the main scale and the index scale are in a desirable positional relationship to each other.

This method is easy and simple, however there are some cases where it is difficult to determine the absolute origin with the accuracy of $\mu m$ order.

Furthermore, when the power is cut off during measurement, a repeated work of zero-clear is necessitated, and further, such a disadvantage has been presented that, even with the renewed zero-clear, it is difficult to zero-set an origin in coincidence with the preceding origin.

Next, there is such a method that, on the main scale, there are provided reference marks in parallel to the length-measuring slit row separately of the length-measuring slit row, and, on the index scale, there are provided marks associated therewith for sensing the reference marks separately of the length-measuring gate slit row, whereby the reference mark is detected by this associated mark and the position thus detected is made to be the absolute origin.

The absolute origin is accurately obtainable by this method. However, a multiplicity of reference marks are arranged along the length-measuring slit row, and at the time of actual measurement, an associated mark of the index scale is superposed on one of the plurality of reference marks, whereby the reference mark should be read to set an absolute origin. In consequence, it becomes necessary to conduct operations to specify one reference mark from the plurality of reference marks, thus presenting the disadvantage that the absolute origin cannot be easily and quickly set.

Furthermore, as another measure, there is a method described in Japanese Patent Publication No. 40684/1983, wherein a multiplicity of reference marks are provided on the main scale in parallel to the length-measuring slit row. Reference mark selecting switches displaceable along the main scale are provided having one of the reference mark selecting switches previously fixed to a position associated with a desirable reference mark, and when the associated mark on the index scale detects a reference mark and simultaneously the reference mark selecting switch is actuated, the reference mark is set as the absolute origin.

However, even with this method, it becomes necessary to conduct operations of judging as to which reference mark to be selected for a position where the reference mark selecting switch should be located, or which reference mark selecting switch to be used out of a plurality of associated mark selecting switches. This method is disadvantageous in that the absolute origin cannot be automatically and quickly set.

Furthermore, the above-described provision of the reference mark selecting switches presents such disadvantages that the displacement detecting apparatus itself becomes long and large-sized, and moreover, the manufacturing cost increases.

The present invention has been developed to obviate the above-described disadvantages of the prior art and has as its object the provision of a photoelectric displacement detecting apparatus wherein an absolute origin can be easily, quickly and automatically set.

Furthermore, another object of the present invention is to provide a photoelectric displacement detecting apparatus wherein an absolute origin can be reliably set and detected with no increase in weight and length of the apparatus and no increase in cost.

DISCLOSURE OF THE INVENTION

The present invention contemplates a photoelectric displacement detecting apparatus comprising a main scale with a length-measuring slit row having regular pitches, an index scale with a length-measuring gate slit row being equal in pitch to the length-measuring slit row of the main scale and disposed in a manner to be parallel to the direction of the slit row and movable relative to the main scale, and a length-measuring photo-electric transducer for receiving light transmitted through or reflected by the main scale and the index scale producing a length-measuring signal from the number of repeated bright and dark portions of the light formed by the repetitions of overlappings of respective slits during a relative movement between the main scale and the index scale. The apparatus further comprises reference marks provided on the main scale in the direction of the length-measuring slit row located at suitable intervals, a mark detecting device provided on the index scale for detecting the reference marks, and identification marks arranged in spaces between the reference marks for identifying the spaces. The identification mark reading device is actuated in response to a detection signal from the mark detecting device to read the identification mark. The apparatus further comprises an identification mark ascertaining device for comparing the identification mark read by the identification mark reading device with an identification mark preset by a mark selecting-setting device to ascertain whether both identification marks coincide with each other or not, and for outputting a coincidence signal, an origin setting device is provided for making the position of the detected reference mark to be the length-measuring origin on condition of the coincidence signal from the identification mark ascertaining device and the mark detection signal from the mark detecting device immediately after the input of the aforesaid coincidence signal.

To the above end, the present invention contemplates that the reference marks are arranged in parallel to the length-measuring slit row and the identification marks are arranged in patterns different from one another between the reference marks.

To the above end, the present invention contemplates that the identification marks are constituted by identification slit rows different in number of slits within the respective spaces and adjacent the reference marks, and the identification reading device comprises reading slits provided on the index scale as opposed to slits of the identification slit rows and a reading photo-electric transducer for outputting a mark identification signal on the basis of the number of repetitions of the bright and dark portions of the received light formed by the repetitions of the overlappings between the reading slits and the identification slit rows.

To the above end, the present invention contemplates that the numbers of slits of the identification slit rows between the respective reference marks are determined such that the numbers of the length-measuring slit groups in positions symmetrical to each other are made equal to each other in directions to opposite ends of the main scale from the substantially central position of the main scale.

To the above end, the present invention contemplates that the identification marks are provided in the respective spaces adjacent the reference marks on one side only.

To the above end, the present invention contemplates that the origin setting device sets the origin such that a counter for counting signals outputted from the length-measuring photo-electric transducer is set to zero.

The above end, the present invention contemplates a photoelectric displacement detecting apparatus comprising a main scale with a length-measuring slit row having regular pitches, an index scale with a length-measuring gate slit row being equal in pitch to the length-measuring slit row of the main scale and disposed in a manner to be in parallel to the direction of the slit row and movable relative to the main scale, and a length-measuring photo-electric transducer for receiving light transmitted through or reflected by the main scale and the index scale and producing a length-measuring signal from the number of repeated bright and dark portions of the light formed by the repetitions of overlappings of respective slits during a relative movement between the main scale and the index scale. A plurality of reference position detecting sections are provided on several intermediate portions of the length-measuring slit row at irregular intervals longer than the length-measuring gate slit row, each of the sections having a length shorter than the length-measuring gate slit row. The length of each of the sections is within such a range of length that a variation in the quantity of light to the length-measuring photo-electric transducer does not affect the measuring accuracy, and the length-measuring slits are lacking from the positions, where the sections are provided, whereby the length-measuring slit row is broken off and divided into length-measuring slit groups different from one another in slit number.

The apparatus comprises reference marks formed on the reference position detecting sections, a mark detecting device provided on the index scale for detecting the reference marks, and a slit group reading devices actuated in response to a detection signal of the mark detecting means to read the number of slits of said length-measuring groups. A length-measuring slit group ascertaining device is provided for comparing the number of slits read by the slit group reading means with the number of slits preset by a slit group selecting-setting device to ascertain whether both slit numbers coincide with each other or not and outputting a coincidence signal. The apparatus further comprises origin setting means for making the position of the detected reference mark to be the length-measuring origin on condition of the coincidence signal from the length-measuring slit group ascertaining means and the mark detection signal immediately after the input of the aforesaid coincidence signal.

To the above end, the present invention contemplates that the mark detecting means is constituted by the detection marks associated in form with the reference marks and a photo-electric transducer for sensing an overlapping of the detection mark and the reference mark.

To the above end, the present invention contemplates that the reference marks are formed into slits of a random pattern, and the detection marks of the mark detecting means are formed into reference gate slits formed of slits of a random pattern, which are associated with the reference marks.

To the above end, the present invention contemplates that the reference marks are formed of non-slit portions provided at least at opposite sides of the length-measuring slit groups.

To the above end, the present invention contemplates that the slit group reading means is a length-measuring counter for counting length-measuring signals outputted from the length-measuring photo-electric transducer.

To the above end, the present invention contemplates a photoelectric displacement detecting apparatus comprising a main scale with a length-measuring slit row having regular pitches, an index scale with a length-measuring gate slit row being equal in pitch to the length-measuring slit row of the main scale and disposed in a manner to be in paralled to the direction of the slit row and movable relative to the main scale, and a length-measuring photo-electric transducer for receiving light transmitted through or reflected by the main scale and the index scale anrd producing a length-measuring signal from the number of repeated bright and dark portions of the light formed by the repetitions of overlappings of respective slits during a relative movement between the main scale and the index scale. The apparatus further comprises a plurality of reference marks arranged on the main scale in parallel to the length-measuring slit row and in irregular pitches, a mark detecting device provided on the index scale for detecting the reference marks, a slit counting device actuated in response to a detection signal from the mark detecting device to count the number of slits of the length-measuring slit groups between the reference mark and the succeeding reference mark when the length-measuring slits between the reference marks are formed into the length-measuring slit groups, an identification mark ascertaining device for comparing the number of slits counted by the slit counting device with the number of slits preset by a reference mark selecting-setting device to ascertain whether both slit numbers coincide with each other and outputting a coincidence signal, and an origin setting means for making the position of the detected reference mark to be the length-measuring origin on condition of the coincidence signal from the identification mark ascertaining device and the mark detection signal form the mark detecting device immediately after the input of the aforesaid coincidence signal.

To the above end, the present invention contemplates that the slit counting device is a length-measuring counter for counting length-measuring signals outputted from the length-measuring transducer.

To the above end, the present invention contemplates that the slit counting means is an auxiliary counter formed separately of the length-measuring counter for counting the length-measuring signals outputted from the length-measuring photo-electric transducer.

BEST MODE FOR CARRYING OUT THE INVENTION

Description will hereunder be given of the present invention with reference to the drawings.

Figure 1:
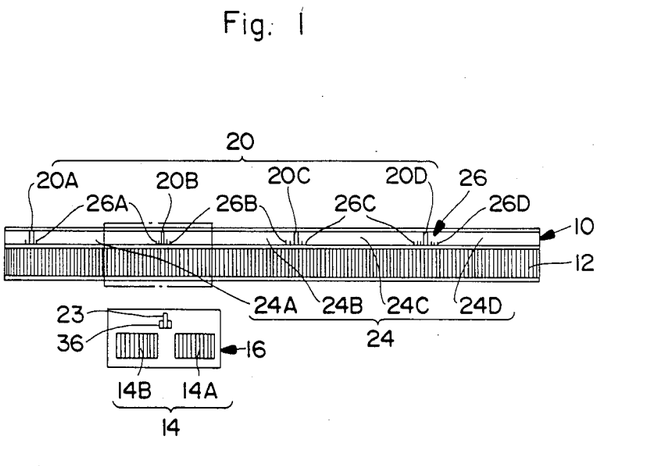
FIG. 1 is a disassembled plan view showing the essential portions of the photo-electric transducer embodying the present invention.
Figure 2:
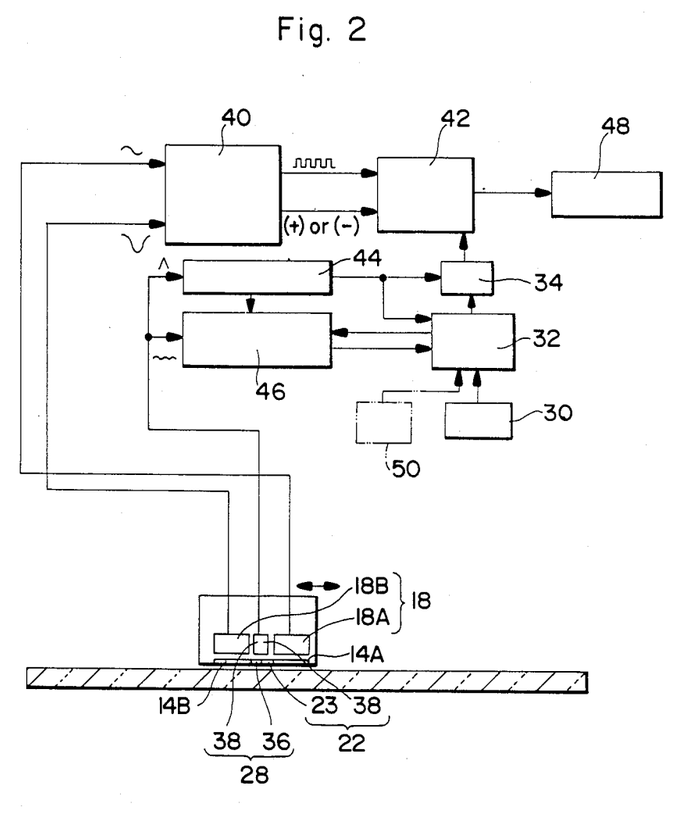
FIG. 2 is a block diagram, partially sectional, showing the above embodiment.

According to this embodiment, a photoelectric displacement detecting apparatus is provided comprising a main scale 10 provided thereon with a length-measuring slit row 12 having regular pitches, an index scale 16 provided thereon with a length-measuring gate slit row 14 being equal in pitch to the length-measuring slit row 12 of the main scale 10 and disposed in a manner to be in parallel to the direction of the slit row and movable relative to the main scale 10, and a length-measuring photo-electric transducer 18 for receiving light transmitted through or reflected by the main scale 10 and the index scale 16 and producing a length-measuring signal from the number of repeated bright and dark portions of the light formed by the repetitions of overlappings of respective slits during a relative movement between the main scale 10 and the index scale 16. The apparatus further comprises a plurality of reference marks 20 (20A, 20B, 20C . . . ) provided on the main scale 10 in the direction of the length-measuring slit row 12 at suitable intervals, a mark detecting means 22 provided on the index scale 16, for detecting the reference marks 20, identification marks 26 arranged in spaces 24 (24A, 24B, 24C . . . ) between the reference marks 20, for identifying the spaces 24 identification mark reading means 28 actuated in response to a detection signal from the mark detecting device 22 to read the identification mark 26 identification mark ascertaining means 32 for comparing the identification mark 26 read by the identification mark reading device 28 with an identification mark preset by a mark selecting-setting device 30 to ascertain whether both identification marks coincide with each other or not and for outputting a coincidence signal, and origin setting means 34 for making the position of the detected reference mark to be the length-measuring origin on condition of the coincidence signal from the identification mark ascertaining device 32 and the mark detection signal from the mark detecting device 22 immediately after the input of the aforesaid coincidence signal.

The reference marks 20 are arranged in parallel to the length-measuring slit row 12, and the identification marks 26 are disposed in patterns different from one another between these reference marks 20. More specifically, the identification marks 26 are constituted by identification slit rows 26A, 26B and 26C . . . different in slit number from one another, disposed adjacent the reference marks 20A, 20B and 20C and in the respective spaces 24A, 24B and 24C . . . , and the identification mark reading device 28 includes a reading slit 36 associated with the identification slit rows 26A, 26B and 26C . . . and a reading photo-electric transducer 38 for outputting a mark identification signal on the basis of the number of repetitions of the bright and dark portions of the light received which are formed by the repetitions of overlappings of the reading slit 36 with the identification slits 26A, 26B and 26C . . . .

As shown in FIG. 1, the reference marks 20 are formed upwardly of the length-measuring slit row 12 of the main scale 10, in parallel to the length-measuring slit row 12 and at regular intervals.

Furthermore, the identification slit rows 26A, 26B and 26C . . . are about one half the length of the reference marks 20. Referring to FIG. 1, in the space 24A between the reference mark 20A at the left end and the reference mark 20B disposed rightwardly of the reference mark 20A, one pitch of the identification slit row 26A is formed contiguously to the right side of the reference mark 20A and also two pitches of the identification slit row 26A are formed contiguously to the left side of the reference mark 20B, thus totally forming three pitches.

Furthermore, referring to FIG. 1, the identification slit row 26B provided in the space 24B between the second reference mark 20B from left and the third reference mark 20C rightwardly adjacent the reference mark 20B includes two pitches disposed contiguously to the right side of the reference mark 20B, as shown, and two pitches disposed contiguously to the left side of the reference mark 20C, thus totally forming four pitches.

Thus, the identification slit row 26C in the space 24C totals up to five pitches, and the identification slit row 26D in the space 24D totals up to six pitches.

The mark detecting means 22 is constituted by a reference gate slit 23 having a height and a pitch being equal to the reference marks 20 and a reading photo-electric transducer 38 in the identification mark reading means 28. Furthermore, a reading slit 36 in the identification mark reading device 28 is constituted by slits disposed contiguously to an opposite side of a standard gate slit 23 and each having a height being equal to the slit of the identification slit row in the identification mark 26.

Furthermore, the length-measuring gate slit row 14 is constituted by a pair of a first and a second gate slit rows 14A and 14B, which are shifted by one-half pitch from each other.

These first and second length-measuring gate slit rows 14A and 14B are disposed separately of each other in the direction of the relative movement between the index scale 16 and the main scale 10, and one of the length-measuring gate slit rows is shifted by one half pitch from the other.

Furthermore, the length-measuring photo-electric transducer 18 is constituted by first and second length-measuring photo-electric transducers 18A and 18B as opposed to the first and the second length-measuring photo-electric transducers 14A and 14B.

In FIG. 2, designated at 40 is a signal processing section, which converts an analogue input signal from the first length-measuring photo-electric transducer 18A into a digital pulse signal and outputs the same to a length-measuring counter 42, discriminates whether the index scale 16 moves to the right or to the left in the drawing from a phase difference between input signals from the first and the second length-measuring photo-electric transducers 18A and 18B, and outputs a plus or a minus signal to the length-measuring counter 42 depending on the direction of the movement.

Furthermore, in FIG. 2, denoted at 44 is a signal processing section of the reference mark detecting device 22 and 46 and identification mark counter of the identification mark reading means 28, respectively. When the reference mark detecting device 22 detects the reference mark 20, the signal processing section 44 is adapted to output a counter clear signal to an identification mark counter 46 and a mark detection signal to the origin setting device 34, respectively.

Furthermore, the identification mark counter 46 is adapted to count the slit number of the identification slit row read by the identification mark reading device 28 and outputs the same to the identification mark ascertaining device 32.

In the drawing, indicated at 48 is an indicating section, which is adapted to indicate or record a measuring dimension corresponding to outputs from the length-measuring counter 42, i.e. pulse count number.

Description will now be given of action of the above embodiment with reference to FIGS. 3 and 4.

Firstly, in FIG. 1, when the reference mark 20D, which is fourth from the left end, is made to be an absolute origin, the slit number or the pitch number of the identification slit row 26C is set by the mark selecting-setting device 30.

Figure 3:
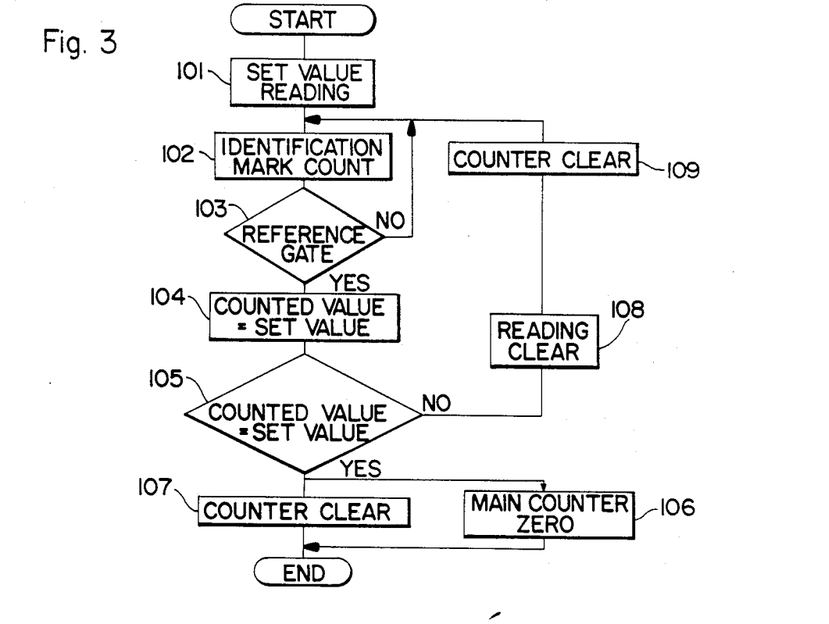
FIG. 3 is a flow chart in explanation of the action of the above embodiment.

As shown in FIG. 3, in step 101, the identification ascertaining device 32 reads a value set by the mark selecting-setting device 30, i.e. a signal for identifying the identification slit row.

In this state, when the index scale 16 is moved to the right in FIG. 1 relative to the main scale 10, the reading slits 36 in the identification mark reading device 28 provided on the index scale 16 successively scans the identification slit rows 26B, 26C and 26D.

At the same time, the reference gate slit 23 interposed between the reading slits 36 scans the reference marks 20B, subsequently, the reference mark 20C, and further, the reference mark 20D, successively.

In this case, on the basis of the number of the bright and dark portions of the light received by the reading photo-electric transducer 38, the identification mark counter 46 counts the slit numbers of the identification slit rows 26B, 26C and 26D, successively (Refer to Step 102). More specifically, as shown in FIG. 4, there are counted the number 8 of intersections of the signal waveforms and the reference mark level between the reference marks 20C and 20D and the number 9 between the reference marks 20D and 20E, respectively.

Figure 4:
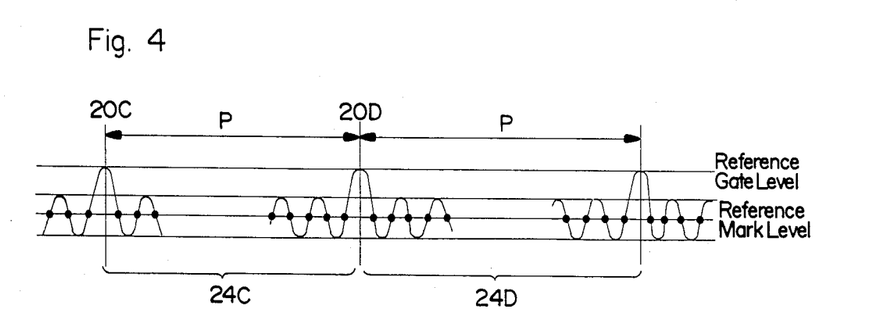
FIG. 4 is a chart showing signal waveforms obtained by the above embodiment.

Furthermore, when the reference gate slit 23 in the mark detecting means 22 coincides with the reference mark 20, since the reference gate slit 23 and the reference mark 20 has a slit length as long as about two times the slit length of the identification slit rows 26B, 26C and 26D, the output from the reading photo-electric transducer 38 becomes larger than those in the identification slit rows as shown in FIG. 4, so that the reference marks 20 can be detected as distinguished from the identification slit rows. When the reference mark is detected, a reference gate signal is outputted to the identification mark counter 46, the identification mark ascertaining device 32 and the origin setting device 34 (Refer to Step 103).

The identification mark ascertaining device 32 reads a counted number of the identification mark counter 46 in response to a reference gate signal inputted from the signal processing section 44 (Refer to Step 104). When the counted number thus read is equal to a value set by the mark selecting-setting device 30, a coincidence signal is outputted to the origin setting means 34 (Refer to Step 105).

When inputted thereto with the coincidence signal from the identification mark ascertaining device 32 and the reference gate signal outputted from the signal processing section 44 at the time of detecting the succeeding reference mark 26D, this origin setting device 34 causes the length-measuring counter 42 to clear and makes it to be an absolute origin (Refer to Sep 106).

Furthermore, while outputting the coincidence signal between the set value and the counted value to the origin setting device 34, the identification mark ascertaining device 32 also outputs the coincidence signal to the identification mark counter 46 to cause it to clear (Refer to Step 107).

Furthermore, the identification mark ascertaining device 32 clears the counted value reading, when the counted value differs from the value set by the mark selecting-setting device 30 (Refer to Step 108), and also outputs a clear signal to the identification mark counter 46 to clear it (Refer to Step 109).

In consequence, the indication section 48 indicates or records a distance from the absolute origin set as above.

In the above case, as shown in FIG. 4, the pulse number obtained from signals corresponding to the identification slit row 26C of the space 24C after the reference mark 20C is detected and counted, whereby the reference mark 20D is identified. When the index scale 16 is moved from the right to the left in FIG. 1 relative to the main scale 10, the reference mark 20D is identified on the basis of the pulse number of the identification slit row 26D.

When the reference mark 20 at another position is made to be the absolute origin, a pertinent identification slit row is selected by the mark selecting-setting device 30, and the selected one is read by the identification mark ascertaining device 32, so that the reference mark 20 adjacent the pertinent identification slit row can be made to be the absolute origin.

If such an arrangement is adopted that, in the mark selecting-setting device 30, an absolute origin can be successively changed and selected in accordance with a predetermined program, then, the mark selecting-setting device 30 is interlocked with a control device of a numerically controlled machine tool or the like, for example, whereby the absolute origin is successively changeable according to the order of machining works, so that the optimum measuring can be automatically conducted.

Furthermore, the absolute origin can be quickly and easily changed in accordance with the shape and size of a material to be worked on through machining.

Here, the identification slit rows 26A, 26C and 26C . . . are formed such that the pitch number is successively increased from the side of 26A. However, the pitch number may be increased or decreased at ransom, and the increased pitch number may be one pitch at the minimum.

Namely, when widths of the bright and the dark portions of the length-measuring slit row 12 in the length-measuring slit row 12 and of the length-measuring slit in the length-measuring gate slit row 14 are made to be 4 μm for example, respectively, as described above, and an analogue signal obtained from the length-measuring photo-electric transducer 18 is divided into eight portions, one of the pulse signals introduced from the signal processing section 38 comes to be 1 μm. Since this displacement detecting apparatus has a resolving-power of 1 μm, even if a difference between the length-measuring slit groups is one pitch of the length-measuring slit, it can be discriminated.

Additionally, in the above embodiment, the identification slit row is specified by the mark selecting-setting device 30 on the basis of the pulse number corresponding to the slit row. However, this specification may be made by some other specifying means, e.g., the specification may be made by use of the slit number of the identification slit row from the end portion of the main scale 10. Or, when the absolute origin is successively changed in the numerically controlled machine tool or the like as described above, the length-measuring slit group may be specified by use of a control signal of a control device 50 of the machine tool or the like as indicated by two-dot chain lines in FIG. 2.

Furthermore, in the above embodiment, description has been given to the case where the index scale 16 moves relative to the main scale 10 from the left to the right in FIG. 1. However, as the means for specifying the reference mark 20 in relation to the identification slit row, the identification slit row disposed rightwardly of the reference mark 20 in the drawing or the identification slit rows on opposite sides of the reference mark 20 may be utilized to specify the absolute origin.

Furthermore, in the above embodiment, the slit numbers of the identification slit rows have been successively increased from the left to the right in the drawing as described above. However, the slit numbers may be successively decreased, or, each of pairs of identification slit rows arranged at symmetrical positions to the right and left from the central portion of the main scale 10 may be equal in slit number to each other for example.

In this case, there is no need of discriminating the movement to the right or left of the index scale.

Further, the identification slit rows may be arranged such that the slit numbers are circulated in a successive increase or decrease.

Furthermore, the identification slit rows in the identification mark 26 are arranged on the right and left sides of the reference mark 20. However, in one and the same space 24, the identification slit rows in the space 24 may be arranged on the right or left side of the reference mark 20 in one way or the other.

When the identification slit rows of each of the identification marks are arranged on the right or left side of the reference mark 20 as described above, there is no need of discriminating the movement to the right or left of the index scale 16 relative to the main scale 10.

Furthermore, the reference marks 20 have been formed of slits. However, the present invention need not necessarily be limited to this, and, for example, the reference marks 22 may be formed of marks completely different from the slits. In these cases, the reference gate slits 34 should necessarily be marks for detecting patterns associated with the reference marks 22.

Figure 5A:
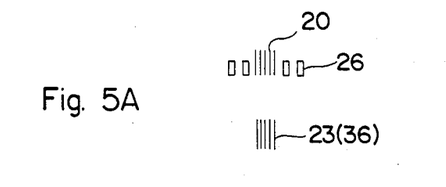
FIG. 5(A) is a plan view showing other patterns of the reference mark, the reference gate slit of the identification slit row and the reading slit in the above embodiment.

Furthermore, identification slit rows 25 have had slits shorter than the slits of the reference marks 20, and further, as associated therewith, the reference gate slits 23 have been formed to be long and the reading slits 36 short. However, such an arrangement may be adopted that, as shown in FIG. 5(A) for example, the reference marks 20 are formed of slits of random patterns similar to those in the embodiment shown in FIG. 1, the identification slit row 26 has slits of very small patterns for the transmission or the reflection, and further, the reference gate slit 23 and the reading slits 36 have a slit or slits of random patterns associated with the reference marks 20.

Figure 5B:
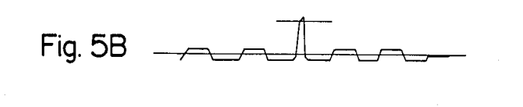
FIG. 5(B) is a chart showing the signal waveforms obtainable by the aforesaid other patterns.

In this case, signals having levels of two types different from each other as shown in FIG. 5(B) can be obtained from outputs of a single light receiver, so that the reference marks can be detected.

Furthermore, the identification slit row 26 has been provided as being associated with one of the reference marks 20, however, such an arrangement may be adopted that two or more, e.g., ten reference marks 20 are formed into a group, an identification slit row 26 is provided for identifying this group, this identification slit row 26 is detected, and thereafter, a predetermined absolute origin can be found from the number of the reference marks 20 detected, i.e., the number of the reference gate signals.

In this case, a counter for counting the reference gate signals should be provided separately.

In this embodiment, even when a large scale of five meter, for example, in which absolute origins are arranged at regular intervals of 50 mm, is used, one identification slit row should be provided for every ten absolute origins. After all, the identification of ten identification slit rows 26 should be performed.

Furthermore, in the above embodiment, the identification mark ascertaining device 32 is adapted to compare the pulse number specified by the mark selecting-setting device 30 with the pulse number inputted from the identification mark reading device 32, and output a coincidence signal when both pulse numbers coincide with each other. However, if the coincidence signal is outputted only when both pulse numbers accurately coincide with each other, an accurate outputting operation may become difficult to perform in timing. In consequence, a predetermined tolerance is provided above and below a preset value, and the coincidence signal should be outputted when both pulse numbers coincide with each other within this tolerance. However, in this case, each of the differences in slit number between the respective identification slit rows should be made larger in value than the tolerance.

Figure 6:
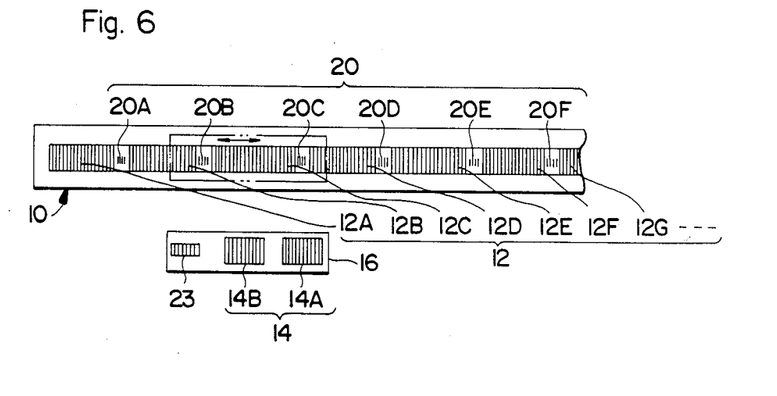
FIG. 6 is a disassembled plan view showing the essential portions of a second embodiment according to the present invention.
Figure 7:
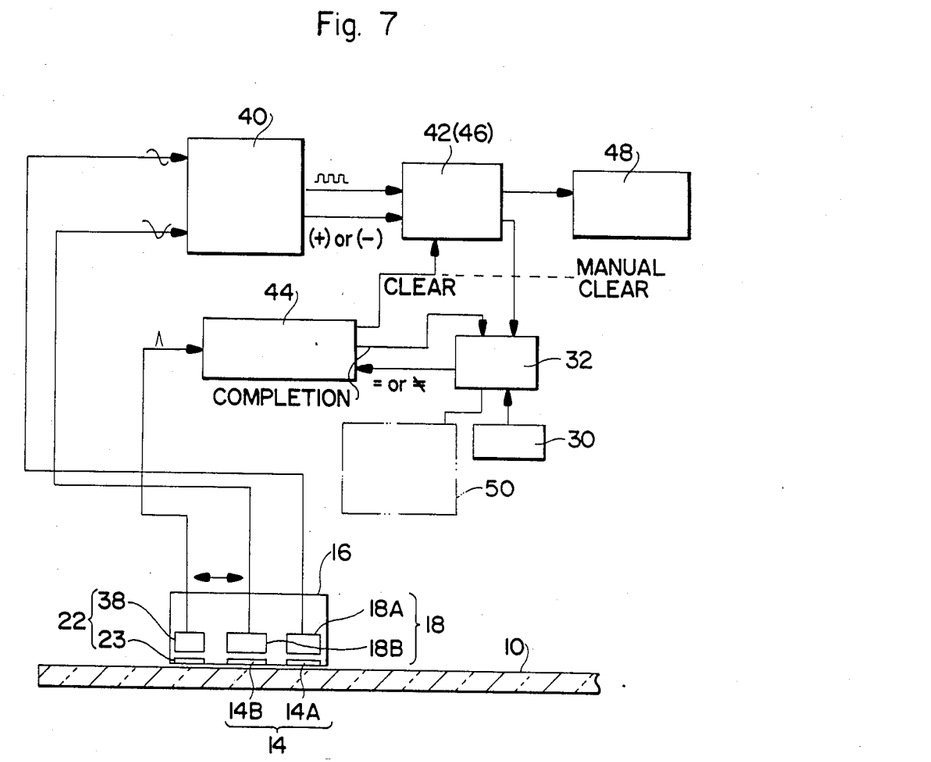
FIG. 7 is a block diagram similar to FIG. 2, showing the second embodiment.

In the above embodiment, the reference marks 20 are arranged in parallel to the length-measuring slit row 12 and the identification marks 26 are arranged between the respective reference marks 20 in patterns different from one another. However, such an arrangement may be adopted that, for example, as shown in FIGS. 6 and 7, the reference marks 20 (20A, 20B and 20C . . . ) are formed at a plurality of portions where the length-measuring slits are removed at irregular intervals on the length-measuring slit row 12, the identification marks are constituted by the length-measuring slit groups 12A, 12B and 12C . . . and the identification mark reading means is formed of a length-measuring counter 42 for counting a length-measuring signal outputted from the length-measuring photo-electric transducer 18.

In this embodiment, the reference gate slit 23 is disposed in series with the length-measuring gate slit row 14, and the reference marks 20 and the reference gate slit 23 are formed of slits of a random pattern discernible from the length-measuring slit row 12 or a slit row identical with the length-measuring slit row 12 and having blank portions on opposite sides thereof to be distinguished from the length-measuring slit row 12.

The arrangements other than the above are similar to those in the first embodiment shown in FIG. 2, whereby same reference numerals in FIG. 2 are used to designate same or similar parts corresponding to ones as shown in FIG. 2, so that the detailed description will be omitted.

In this embodiment, the reference marks 20 are provided at several intermediate positions of the length-measuring slit row 12, so that the width of the main scale 10 can be decreased.

Furthermore, as far as the respective length-measuring slit groups 12A, 12B and 12C . . . are equal in their pitches, the lengths of the blank portions of the length-measuring slit row 12, where the reference mark 20 is provided, may not be constant, so that the main scale 10 can be easily produced.

Figure 8:
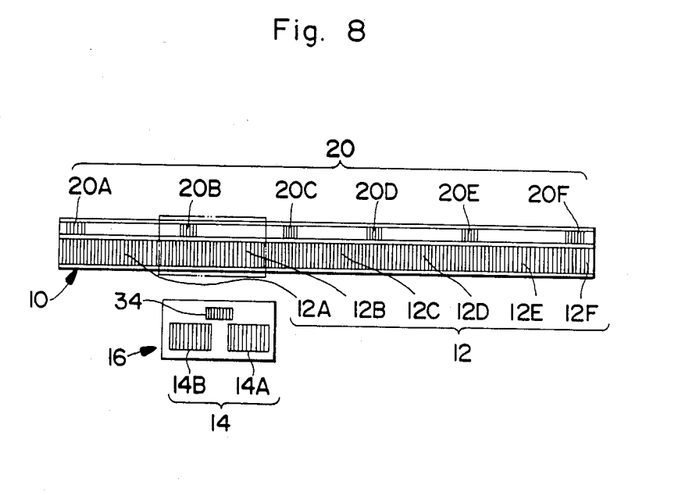
FIG. 8 is a disassembled plan view showing the essential portions of a third embodiment.
Figure 9:
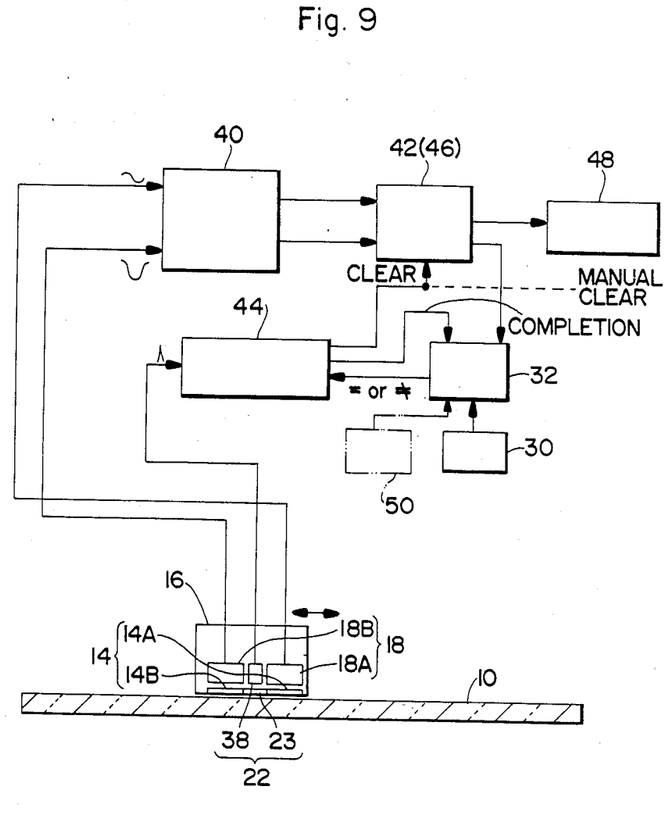
FIG. 9 is a block diagram similar to FIG. 2, showing the third embodiment.

Description will hereunder be given of the third embodiment of the present invention with reference to FIGS. 8 and 9.

In this third embodiment, the reference marks 20 (20A, 20B and 20C . . . ) are arranged along the length-measuring slit row 12, in parallel thereto and at irregular intervals, the reference marks are constituted by the length-measuring slit row 12 disposed between the reference marks 20, and the identification mark reading device is formed of the length-measuring counter 42 for counting the length-measuring signal outputted from the length-measuring photo-elecric transducer 18.

More specifically, in this embodiment, the length-measuring slit row 12 disposed between the respective reference marks 20A, 20B and 20C . . . are made to be the respective length-measuring slit groups 12A, 12B and 12C . . . and the length-measuring slit groups are different in slit number from one another, to thereby constitute the identification marks.

In consequence, in this embodiment, the slit numbers of the length-measuring slit groups 12A, 12B and 12C . . . which are associated with the reference marks 20, respectively, are counted, thus enabling to specify the reference marks 20.

The arrangements other than the above are similar to those in the first embodiment, whereby same reference numerals are used to designate same or similar parts corresponding to one as shown in the first embodiment, so that the detailed description will be omitted.

INDUSTRIAL APPLICABILITY

As has been described hereinabove, the present invention is so useful that, in the photoelectric displacement detecting apparatus, the absolute origin can be easily, reliably and automatically set with a simplified arrangement and without the apparatus being large-sized, increased in weight and increased in cost to a considerable extent.

We claim:

1. A photoelectric displacement detecting apparatus comprising: a main scale provided thereon with a length-measuring slit row having length-measuring slits thereon at regular pitches; an index scale provided thereon with a length-measuring gate slit row being equal in pitch to the length-measuring slit row of said main scale and disposed in a manner to be in parallel to the direction of the length-measuring slit row and movable relative to said main scale; and a length-measuring photo-electric transducer for receiving light transmitted through or reflected by said main scale and said index scale, and producing a length-measuring signal from the number of repeated bright and dark portions of the light formed by the repetitions of overlappings of respective slits during a relative movement between said main scale and said index scale; wherein length-measuring slit lacking sections are provided on several intermediate portions of said length-measuring slit row at irregular intervals longer than said length-measuring gate slit row, each of said slit lacking sections has a length shorter than said length-measuring gate slit row, the length of each of said slit lacking sections is within such a range of length that a variation in the quantity of the light to said length-measuring photo-electric transducer does not affect the measuring accuracy, and said length-measuring slits are lacking from portions where said slit lacking sections are provided, whereby said length-measuring slit row is broken off and divided into length-measuring slit groups being different in slit number from one another;

reference marks formed on said slit lacking sections;
mark detecting means provided on said index scale for detecting said reference marks;
slit group reading means actuated in response to a mark detection signal of said mark detecting means to read the number of slits of said length-measuring groups;
length-measuring slit group ascertaining means for comparing the number of slits read by said slit group reading means with the number of slits preset by a slit group selecting-setting device to ascertain whether both slit numbers coincide with each other or not and outputting a coincidence signal; and
origin setting means for making the position of said detected reference mark to be a length-measuring origin on condition of the coincidence signal from said length-measuring slit group ascertaining means and the mark detection signal from said mark detecting means immediately after the input of said coincidence signal.

2. A photoelectric displacement detecting apparatus as set forth in claim 1, wherein said mark detecting means comprises detection marks associated in form with said reference marks and a photo-electric transducer for sensing an overlapping of said detection mark and said reference mark.

3. A photoelectric displacement detecting apparatus as set forth in claim 1, wherein said reference marks are formed into slits of a random pattern, and the detection marks of said mark detecting means are formed into reference gate slits formed of slits of random patterns, which are associated with said reference marks.

4. A photoelectric displacement detecting apparatus as set forth in claim 1, wherein said reference marks are formed of non-slit portions provided at least at opposite sides of the length-measuring slit groups.

5. A photoelectric displacement detecting apparatus as set forth in claim 1, wherein said slit group reading means is a length-measuring counter for counting length-measuring signals outputted from said length-measuring photo-electric transducer.

6. A photoelectric displacement detecting apparatus as set forth in claim 2, wherein said slit group reading means is a length-measuring counter for counting length-measuring signals outputted from said length-measuring photo-electric transducer.

7. A photoelectric displacement detecting apparatus as set forth in claim 3, wherein said slit group reading means is a length-measuring counter for counting length-measuring signals outputted from said length-measuring photo-electric transducer.

8. A photoelectric displacement detecting apparatus as set forth in claim 4, wherein said slit group reading means is a length-measuring counter for counting length-measuring signals outputted from said length-measuring photo-electric transducer.

9. A photoelectric displacement detecting apparatus comprising: a main scale provided thereon with a length-measuring slot row having length-measuring slits thereon at regular pitches; an index scale provided thereon with a length-measuring gate slit row being equal in pitch to said length-measuring slit row of said main scale and disposed in a manner to be in parallel to the direction of the length-measuring slit row and movable relative to said main scale; and a length-measuring photo-electric transducer for receiving light transmitted through or reflected by said main scale and said index scale, and producing a length-measuring signal from the number of repeated bright and dark portions of the light formed by the repetitions of overlappings of respective slits during a relative movement between said main scale and said index scale (16);

a plurality of reference marks arranged on said main scale in parallel to said length-measuring slit row and in irregular pitches;

mark detecting means provided on said index scale for detecting said reference marks;

slit counting means actuated in response to a mark detection signal from said mark detecting means to count the number of slits of said length-measuring slit groups between a reference mark and a succeeding reference mark wherein the length-measuring slits between the reference marks are formed into said length-measuring slits groups;

identification mark ascertaining means for comparing the number of slits counted by said slit counting means with the number of slits preset by a reference mark selecting-setting device to ascertain whether both slit numbers coincide with each other and outputting a coincidence signal; and origin setting means for making the position of a detected reference mark to be the length-measuring origin on condition of said coincidence signal from said identification mark ascertaining means and the mark detection signal from said mark detecting means immediately after the input of said coincidence signal.

10. A photoelectric displacement detecting apparatus as set forth in claim 9, wherein said slit counting means is a length-measuring counter for counting length-measuring signals outputted from said length-measuring photo-electric transducer.

11. A photoelectric displacement detecting apparatus as set forth in claim 9, wherein the number of slits of the length-measuring slit row between respective reference marks are determined such that the slit numbers between the reference marks arranged at symmetrical positions to opposite sides from the substantially central portion of said main scale are equal to each other.

12. A photoelectric displacement detecting apparatus as set forth in claim 10, wherein the number of slits of the length-measuring slit row between respective reference marks are determined such that the slit numbers between the reference marks arranged at symmetrical positions to opposite sides from the substantially central portion of said main scale are equal to each other.

* * * * *